(12) United States Patent
Liu

(10) Patent No.: US 10,121,669 B2
(45) Date of Patent: Nov. 6, 2018

(54) FLASH MEMORY FABRICATION METHOD

(71) Applicant: SEMICONDUCTOR MANUFACTURING INTERNATIONAL (SHANGHAI) CORPORATION, Shanghai (CN)

(72) Inventor: Jinhua Liu, Beijing (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/815,867

(22) Filed: Jul. 31, 2015

(65) Prior Publication Data
US 2016/0064396 A1 Mar. 3, 2016

(30) Foreign Application Priority Data
Aug. 28, 2014 (CN) .......................... 2014 1 0432340

(51) Int. Cl.
H01L 21/28 (2006.01)
H01L 29/423 (2006.01)
H01L 29/66 (2006.01)
H01L 29/10 (2006.01)
H01L 29/06 (2006.01)
G11C 16/34 (2006.01)

(52) U.S. Cl.
CPC .. *H01L 21/28273* (2013.01); *H01L 29/42324* (2013.01); *H01L 29/66825* (2013.01); *G11C 16/3427* (2013.01); *H01L 29/0649* (2013.01); *H01L 29/1083* (2013.01)

(58) Field of Classification Search
CPC ......... H01L 21/28273; H01L 29/42324; H01L 29/66825; H01L 29/0649; H01L 29/1083; G11C 16/3427
See application file for complete search history.

(56) References Cited

U.S. PATENT DOCUMENTS

| | | | | |
|---|---|---|---|---|
| 5,434,813 A * | 7/1995 | Tamura | ............. | H01L 29/66825 257/316 |
| 6,228,717 B1 * | 5/2001 | Hazama | ............. | H01L 21/28247 257/E21.209 |
| 6,281,558 B1 * | 8/2001 | Sayama | .......... | H01L 21/823462 257/371 |
| 6,294,481 B1 * | 9/2001 | Inumiya | ............ | H01L 21/28185 257/E21.248 |
| 2002/0055217 A1 * | 5/2002 | Kanamori | ......... | H01L 21/76202 438/221 |
| 2006/0131641 A1 * | 6/2006 | Ozawa | ............. | H01L 21/28273 257/321 |

(Continued)

Primary Examiner — Su C Kim
(74) Attorney, Agent, or Firm — Kilpatrick Townsend & Stockton LLP

(57) ABSTRACT

A semiconductor device and a method of fabricating the same are provided. The semiconductor device includes a semiconductor substrate comprising an active region, and successive layers of a tunnel oxide layer, a floating gate, a gate dielectric layer, a control gate overlying each other. A first portion of the tunnel oxide layer disposed on an edge of the active region has a thickness that is greater than a thickness of a second portion of the tunnel oxide layer disposed away from the edge of the active region. Such features ensure efficient reduction of read disturb errors of a Flash memory device.

15 Claims, 6 Drawing Sheets

(56) References Cited

U.S. PATENT DOCUMENTS

| | | | |
|---|---|---|---|
| 2008/0014698 A1* | 1/2008 | Prall | H01L 21/26506 438/257 |
| 2010/0025754 A1* | 2/2010 | Shiba | H01L 27/11568 257/326 |
| 2012/0018805 A1* | 1/2012 | Kato | H01L 21/0332 257/345 |

* cited by examiner

FLASH MEMORY FABRICATION METHOD

CROSS-REFERENCES TO RELATED APPLICATIONS

This application claims priority to Chinese patent application No. 201410432340.1, filed on Aug. 28, 2014, the content of which is incorporated herein by reference in its entirety.

BACKGROUND OF THE INVENTION

The present invention relates to semiconductor devices, and more particularly to a semiconductor device and method for manufacturing the same.

Flash memory devices are widely used in various products due to their advantages such as data-holding capability. In Flash memory devices such as p-Flash, under repeated programming and erasing operations, the high voltage programming can damage the tunnel oxide layer, so that enough stored charge can be lost through the damaged tunnel oxide, leading to erase/read disturb errors.

FIG. 1 is a simplified cross-sectional view of a conventional structure of a semiconductor device containing a flash memory. The conventional structure includes a semiconductor substrate 100, a tunnel oxide layer 101 overlying semiconductor substrate 100, a floating gate 102 overlying tunnel oxide layer 101, an interlayer dielectric layer 103 overlying floating gate 102, and a control gate 104 overlying interlayer dielectric layer 103. The thickness of a portion 1011 of tunnel oxide layer 101 located at the edge of the active region is generally thinner than the thickness of a portion of tunnel oxide layer 101 located in the center of the active region, so that portion 1011 is the most vulnerable portion of tunnel oxide layer 101 and prone to damage, leading to erase or read disturb errors.

To solve the above problems, the prior art techniques increase the thickness of portion 1011 of tunnel oxide layer 101 located at the edge. For example, in the manufacturing of a semiconductor device having a 55 nm process technology node, the thickness of the tunnel oxide layer 101 is increased from the standard 89 Angstroms to 93 Angstroms or even to 98 Angstroms. However, this approach of increasing the thickness of portion 1011 of tunnel oxide layer 101 at the edge of the active region also increases the thickness of the portion of tunnel oxide layer 101 located in the center region of the active region, and this will adversely affect the programming and erasing efficiency.

As is described above, it is difficult to ensure the programming and erasing performance while reducing read and erase disturbance. Therefore, there is a need for a novel semiconductor device and method for manufacturing the same.

BRIEF SUMMARY OF THE INVENTION

Embodiments of the present invention provide a semiconductor device including a Flash memory device, and a method for manufacturing such semiconductor device that can ensure efficient reduction of read disturb errors of the Flash memory device.

In accordance with the present invention, a semiconductor device includes a semiconductor substrate comprising an active region, a tunnel oxide layer overlying the semiconductor substrate, a floating gate overlying the tunnel oxide layer, a gate dielectric layer overlying the floating gate, and a control gate overlying the gate dielectric layer. A first portion of the tunnel oxide layer disposed on an edge of the active region has a thickness greater than a thickness of a second portion of the tunnel oxide layer disposed away from the edge of the active region.

In an embodiment, the thickness of the second portion of the tunnel oxide layer is about 89 Angstroms.

In an embodiment, the semiconductor device further includes a shallow trench isolation structure disposed at opposite sides of the active region.

In an embodiment, the semiconductor device further includes a tunnel oxide thickness enhancing region disposed adjacent to the shallow trench isolation structure. The tunnel oxide thickness enhancing region includes F ions.

In an embodiment, the gate dielectric layer includes a silicon oxide/silicon nitride/silicon oxide (ONO) structure.

In an embodiment, the hard mask includes a stack of a first hard mask layer including silicon oxide and a second hard mask layer including silicon nitride.

Embodiments of the present invention provide a method for manufacturing a semiconductor device. The method may include providing a semiconductor substrate containing an active region, forming a hard mask on the semiconductor substrate, etching the semiconductor substrate using the hard mask as a mask to form a trench, performing an ion implantation onto the semiconductor layer to form a tunnel oxide thickness enhancing region adjacent to the trench and facing toward the active region, forming a shallow trench isolation structure in the trench, removing the hard mask, forming a tunnel oxide layer in a location previously occupied by the hard mask. A first portion of the tunnel oxide layer disposed on the edge of the active region has a thickness greater than a thickness of a second portion of the tunnel oxide layer disposed away from the edge of the active region. The method may also include forming a floating gate on the tunnel oxide layer, removing excess of an insulating material filled in the shallow trench isolation structure that is over a surface of the semiconductor substrate, forming a gate dielectric layer overlying the floating gate, and forming a control gate overlying the gate dielectric layer.

In an embodiment, the ion implantation comprises F ions.

In an embodiment, forming the shallow trench isolation structure may include filling an insulating material in the trench, and performing a CMP process to remove excess of the insulating material over a surface of the hard mask.

In an embodiment, performing the ion implantation comprises a fluorine gas ($F_2$).

Embodiments of the present invention also provide an electronic device including an electronic component and a semiconductor device that is electrically connected with the electronic component. The semiconductor device can be manufactured using the above-described method.

The following description, together with the accompanying drawings, will provide a better understanding of the nature and advantages of the claimed invention.

DETAILED DESCRIPTION OF THE INVENTION

Figure 1:
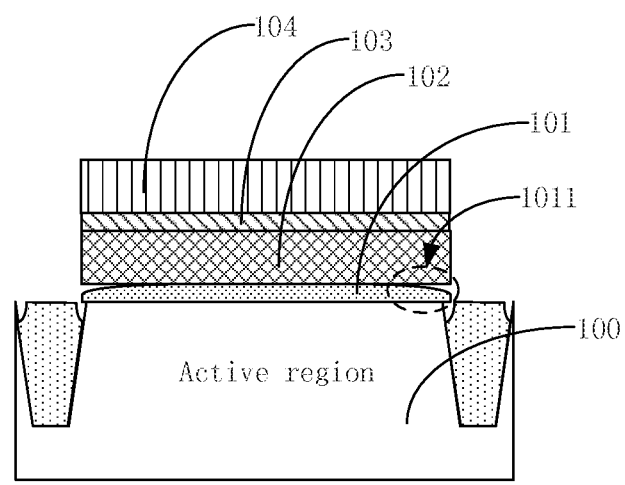
FIG. 1 is a simplified cross-sectional view of a semiconductor device according to the prior art.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "overlying," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a", "an" and "the" may include singular and plural references. It will be further understood that the terms "comprising", "including", having", "containing" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items.

The term "vertical" as used in this application is defined as a plane perpendicular to the conventional plane or surface of a wafer or substrate, regardless of the orientation of the wafer or substrate. The term "horizontal" refers to a direction perpendicular to the vertical as defined above.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Prepositions, such as "on", "side" (as in "sidewall"), "below", "above", "higher", "lower", "over" and "under" are defined with respect to the conventional plane or surface being on the top surface of the wafer or substrate, regardless of the orientation of the wafer or substrate. It will be understood that these terms are intended to encompass different orientations of the device in addition to the orientation depicted in the figures.

Embodiment 1

Figure 2:
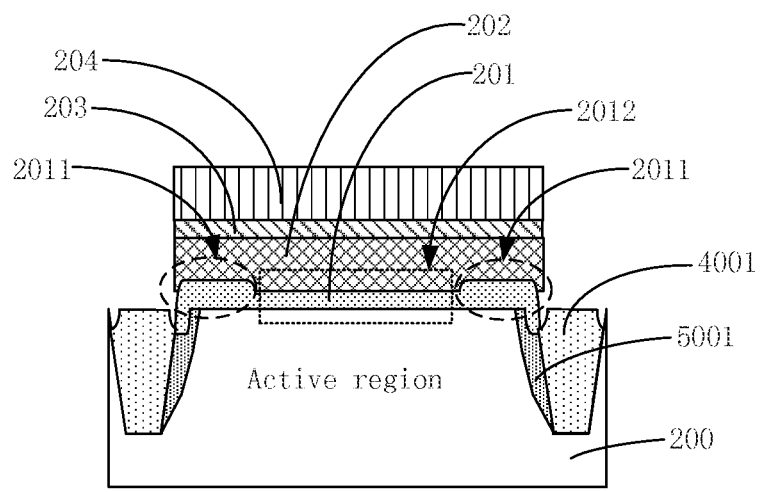
FIG. 2 is a simplified cross-sectional view of a semiconductor device according to an embodiment of the present invention.

Embodiments of the present invention provide a semiconductor device such as a Flash memory device (e.g., p-Flash), or a semiconductor device containing a flash memory device. FIG. 2 is a simplified cross-sectional view of a semiconductor device according to an embodiment of the present invention.

Referring to FIG. 2, a semiconductor device includes a semiconductor substrate 200, a tunnel oxide layer 201 disposed on semiconductor substrate 200, a floating gate 202 on tunnel oxide layer 201, an interlayer dielectric layer 203 on floating gate 202, and a control gate 204 on interlayer dielectric layer 203. In the embodiment, the thickness of a portion 2011 of tunnel oxide layer 201 disposed on an edge of the active region is greater than the thickness of a portion

2012 of tunnel oxide layer 201 disposed in the center of the active region. The term "edge of an active region" will be used herein to refer to edges or peripheral region away from the center of the active region. Conversely, the term "center of the active region" is referred to the region away from the edges or peripheral region of the active region.

Tunnel oxide layer 201 is also referred to as gate dielectric layer. In the embodiment, the thickness of portion 2012 of tunnel oxide layer 201 located away from the edges or periphery of the active region may be the standard thickness of a corresponding process technology node, e.g., the thickness of the central region 2012 of tunnel oxide layer 201 is about 89 Angstrom using a semiconductor process of a 55 nm process technology node.

As is clearly seen in FIG. 2, the thickness of central portion 2012 of the tunnel oxide layer 201 remains unchanged, so that the programming and erasing efficiency of the semiconductor device can be ensured. Meanwhile, since the thickness of portion 2011 of tunnel oxide layer 201 disposed on the edge active region has increased, a loss of stored charge can be prevented, thereby reducing reading stress and erase disturb of the semiconductor device.

In the embodiment, the semiconductor device further includes a shallow trench isolation 4001 located on opposite sides of the active region of the semiconductor device, as shown in FIG. 2. In addition, the semiconductor device may also include a tunnel oxide thickness enhancing region 5001 located in semiconductor substrate 200 at the edge of the active region 2011, as shown in FIG. 2. In an embodiment, tunnel oxide thickness enhancing region 5001 includes F ions.

Tunnel oxide thickness enhancing region 5001 may enhance the formation of the tunnel oxide layer during the manufacturing process of the semiconductor device, thereby ensuring that the thickness of portion 2011 of tunnel oxide layer 201 on the edge of the active region is greater than the thickness of portion 2012 of tunnel oxide layer 201 located in the center of the active region.

The thickness of portion 2011 of tunnel oxide layer 201 on the edge of the active region is greater than the thickness of portion 2012 of the tunnel oxide layer located on the center of the active region, thereby ensuring the programming and erasing efficiency of the Flash memory device while reducing reading stress and erase disturb.

Embodiment 2

FIGS. 3A through 3H are simplified cross-sectional views of intermediate structures at different stages of a semiconductor device according to an embodiment of the present invention. FIG. 4 is a flow chart of a method for manufacturing a semiconductor device according to an embodiment of the present invention.

Figure 3A:
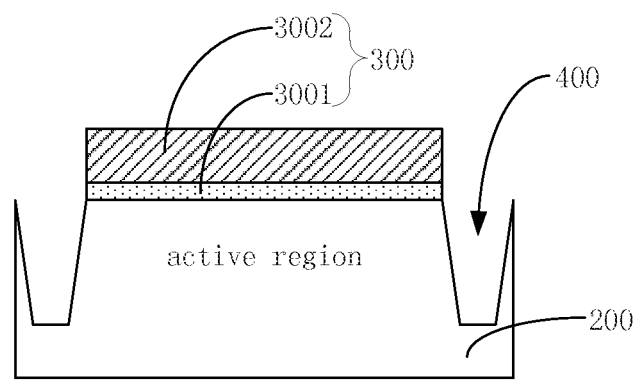
FIGS. 3A through 3H are simplified cross-sectional views of intermediate structures at different stages of a semiconductor according to an embodiment of the present invention.
Figure 4:
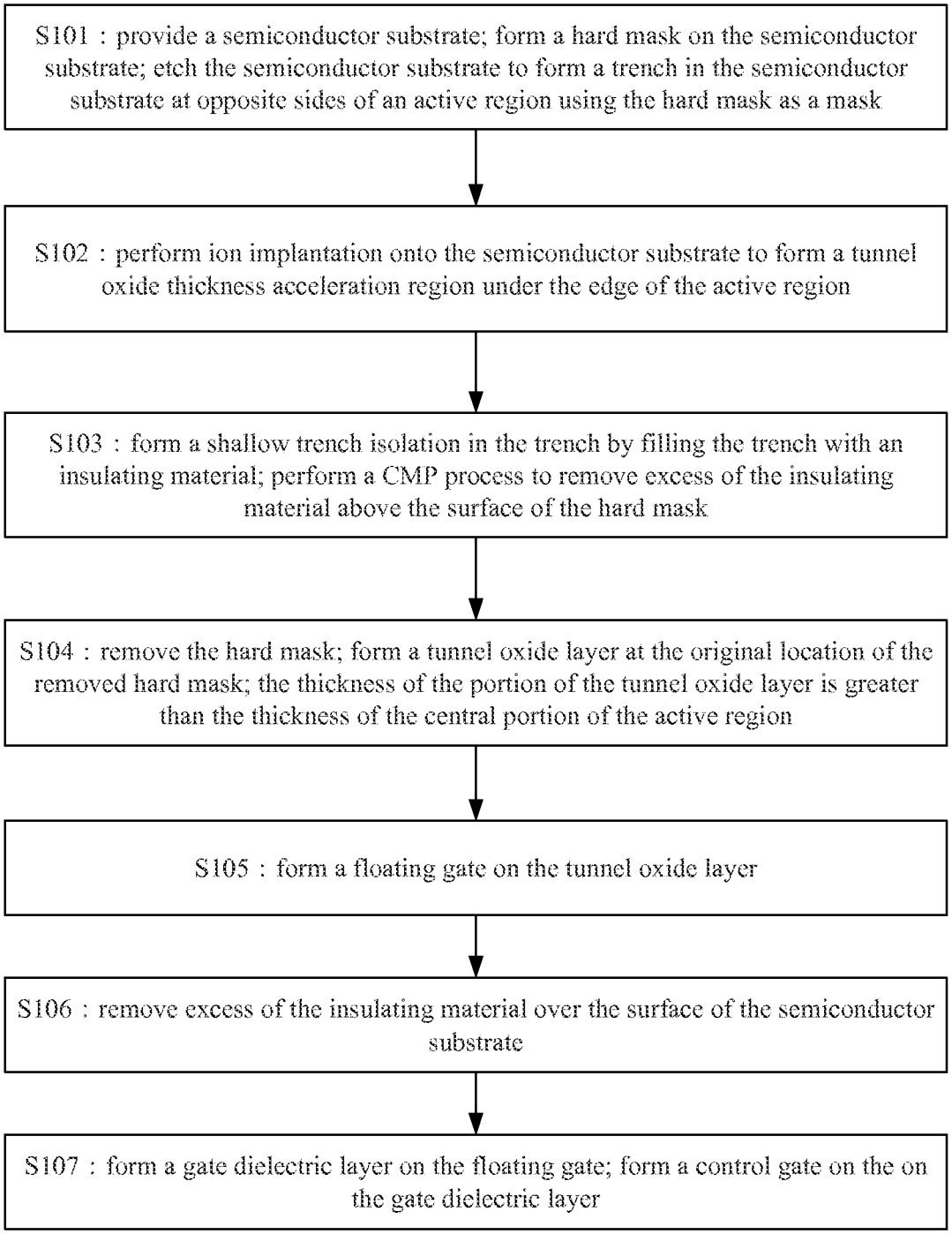
FIG. 4 is a flow chart of a method for manufacturing a semiconductor device according to an embodiment of the present invention.

With reference to FIGS. 3A-3H and FIG. 4, a method for manufacturing a semiconductor device according to an embodiment of the present invention will be described in detail. The method may include the following steps:

Step A1: provide a semiconductor substrate 200 including an active region; form a hard mask 300 on the semiconductor substrate; etch the semiconductor substrate using the hard mask layer as a mask to form a trench 400 in the semiconductor substrate on opposite sides of the active region, as shown in FIG. 3A.

In an embodiment, hard mask 300 may include a first hard mask layer 3001 and a second hard mask layer 3002 overlying the first hard mask layer, as shown in FIG. 3A. First hard mask layer 3001 may include silicon oxide, and second hard mask layer 3002 may include silicon nitride.

In the present disclosure, semiconductor substrate 200 may be a monocrystalline silicon substrate, polysilicon substrate, SOI substrate, or other suitable substrate, but is not limited thereto.

Figure 3B:
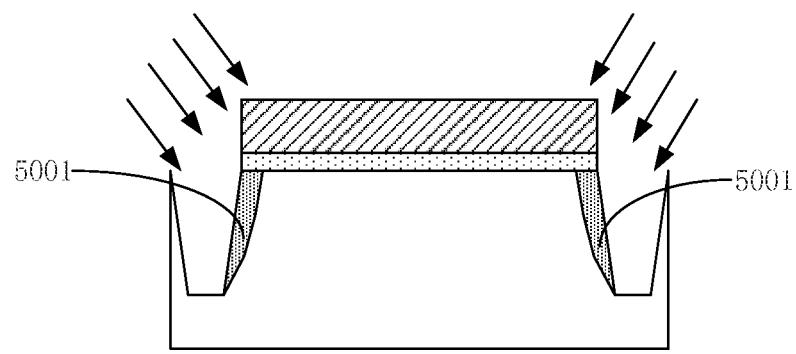

Step A2: perform an ion implantation onto semiconductor substrate 200 to form a tunnel oxide thickness enhancing region 5001 adjacent to trench 400 below hard mask at the edge of the active region, as shown in FIG. 3B.

In an embodiment, the ion implantation may include F ions as dopants or other suitable dopants. The F dopant ions may use fluorine gas ($F_2$) as the ion source.

Tunnel oxide thickness enhancing region 5001 can enhance the formation of a tunnel oxide layer, thereby ensuring that the thickness of the portion of the tunnel oxide layer on the edge of the active region is greater than the thickness of the portion of the tunnel oxide layer on the center of the active region.

Figure 3C:
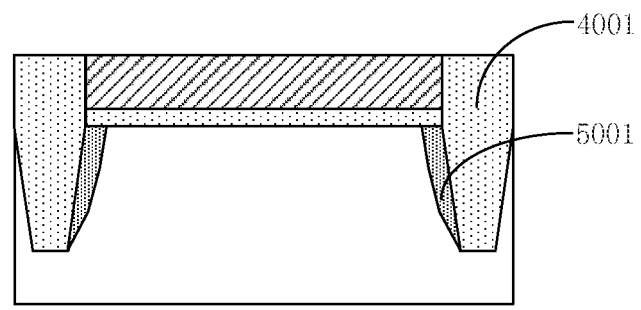

Step A3: form a shallow trench isolation (STI) structure 4001 in trench 400, as shown in FIG. 3C.

In an embodiment, shallow trench isolation structure 4001 is formed using the following steps:
Fill trench 400 with an insulating material; and
Perform a chemical mechanical polishing (CMP) process to remove excess of the insulating material disposed above hard mask 300 to form insulation-filled shallow trench isolation structure 4001.

The insulating material may be silicon oxide or other suitable insulating materials.

Figure 3D:
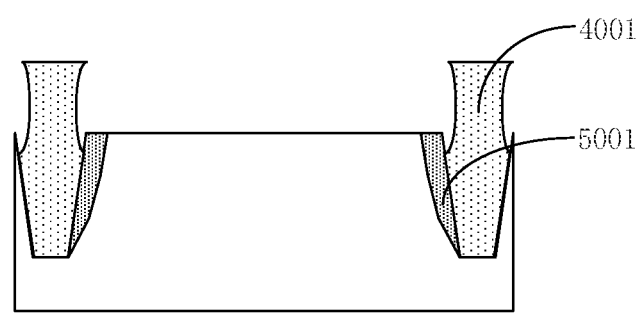

Step A4: remove hard mask 300, as shown in FIG. 3D.

In an embodiment, hard mask 300 may be removed using an etch process or other suitable processes.

Figure 3E:
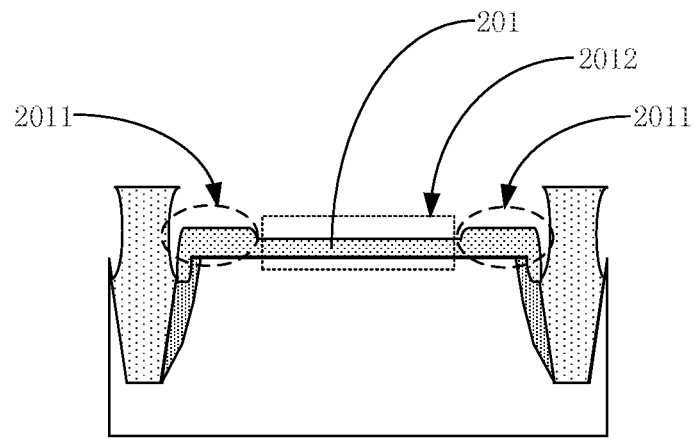

Step A5: form a tunnel oxide layer 201 in the original location of previous hard mask 300 that has been removed. The thickness of a portion 2011 of tunnel oxide layer 201 located on the edge of the active region is greater than the thickness of a portion 2012 of tunnel oxide layer 201 located on the center of the active region, as shown in FIG. 3E. In other words, portion 2011 of the tunnel oxide layer disposed over tunnel oxide thickness enhancing region 5001 has a thickness greater than the thickness of other regions of tunnel oxide layer 201 disposed away from the edge of the active region.

In the embodiment, since tunnel oxide thickness enhancing region 5001 can enhance the formation of the tunnel oxide thickness, the thickness of tunnel oxide layer 201 located on the edge of the active region is thus greater than the thickness of tunnel oxide layer 201 located on the center of the active region.

Experimental results showed, under the same process conditions, the thickness of the tunnel oxide layer on the edge of the active region is about 22.2 Angstroms when processed without tunnel oxide thickness enhancing region 5001, and the thickness of the tunnel oxide layer on the edge of the active region is about 23.1 Angstroms when processed with tunnel oxide thickness enhancing region 5001. Accordingly, based on the conducted experimental results, tunnel oxide thickness enhancing region 5001 does enhance the thickness increase so that the thickness of portion 2011 of tunnel oxide layer 201 on the edge of the active region is greater than the thickness of portion 2012 of tunnel oxide layer 201 on the center of the active region.

Experimental results have shown that the thickness of the central active region of the tunnel oxide layer in a semiconductor device manufactured according to the present invention can be kept unchanged, thereby ensuring the device programming and erasing efficiency. At the same time, since the thickness of the portion of tunnel oxide layer 201 on the edge of the active region has increased, the portion of the tunnel oxide layer on the edge of the active region will not be damaged, thereby preventing loss of a stored charge and reducing read stress and erase disturb of the semiconductor device.

Figure 3F:
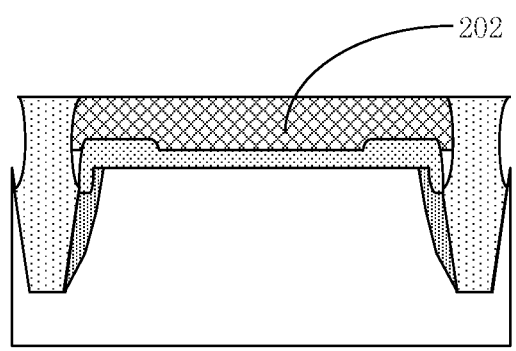

Step A6: form a floating gate 202 on tunnel oxide layer 201, as shown in FIG. 3F.

In an embodiment, floating gate 202 can be formed by depositing a floating gate material and performing a CMP process on the deposited floating material. The floating gate material can be polysilicon or other suitable materials.

Figure 3G:
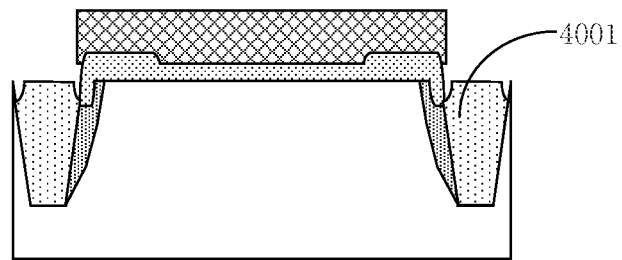

Step A7: remove excess trench filling material of STI structure 4001 that is above the surface of semiconductor substrate 200 so that the thus formed STI structure 4001 has an upper surface flush (coplanar) with the surface of semiconductor substrate 200, as shown in FIG. 3G.

In an embodiment, the excess trench filling material of STI structure 4001 above the surface of semiconductor substrate 200 can be removed using an etching process or other suitable processes.

Figure 3H:
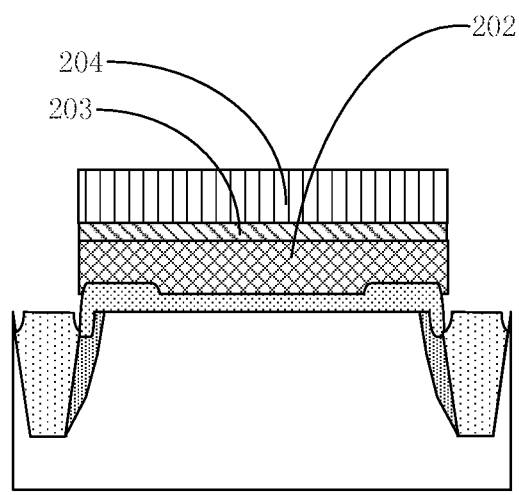

Step A8: form a gate dielectric layer 203 on floating gate 202; and form a control gate 204 on gate dielectric layer 203, as shown in FIG. 3H.

In an embodiment, gate dielectric layer 203 may be an oxide-nitride-oxide layer including a laminated structure of a silicon oxide, silicon nitride, and a silicon nitride. Control gate 204 may include silicon oxide or other suitable materials.

This completes the description of key steps of a method for manufacturing a semiconductor device according to an embodiment of the present invention. In an embodiment of the present invention, the method may include other steps after step A8, which are not described herein for brevity reasons.

In accordance with the present invention, through the tunnel oxide thickness enhancing region, the thickness of the tunnel oxide layer on the edge of the active region is greater than the thickness of the tunnel oxide layer on the center of the active region, read stress and erase disturb can be reduced, thereby improving the programming and erasing efficiency of the Flash device.

FIG. 4 is a simplified flow chart of a method of manufacturing a semiconductor device according to one embodiment of the present invention. The method may include:

S101: provide a semiconductor substrate; form a hard mask on the semiconductor substrate; etch the semiconductor substrate using the hard mask as a mask to form a trench in the semiconductor substrate defining an active region. In other words, the trench is located at opposite sides of the active region. The trench is used to form a shallow trench isolation (STI) structure (FIG. 3A);

S102: perform an ion implantation onto the semiconductor substrate to form a tunnel oxide thickness enhancing region adjacent to the trench at opposite sides of the active region (FIG. 3B);

S103: form a shallow trench isolation structure in the trench by filling the trench with an insulating material; perform a CMP process to remove excess of the insulating material above the surface of the hard mask so that the surface of the shallow trench isolation structure is flush with the surface of the hard mask (FIG. 3C);

S104: remove the hard mask (FIG. 3D); form a tunnel oxide layer in the previous location of the hard mask that has been removed. The thickness of a portion of the tunnel oxide layer disposed on the edge of the active region is greater than the thickness of a portion of the tunnel oxide layer disposed on the center of the active region (FIG. 3E);

S105: form a floating gate on the tunnel oxide layer (FIG. 3F);

S106: remove excess of the trench filling material of the STI structure that is over the surface of semiconductor substrate 200 so that the thus formed STI structure has an upper surface flush (coplanar) with the surface of semiconductor substrate (FIG. 3G);

S107: form a gate dielectric layer on the floating gate, and form a control gate on the gate dielectric layer (FIG. 3H).

In an embodiment, the gate dielectric layer includes a silicon oxide/silicon nitride/silicon oxide (ONO) structure.

In an embodiment, the hard mask includes a stack of a first hard mask layer comprising silicon oxide and a second hard mask layer comprising silicon nitrite.

Embodiment 3

Embodiments of the present invention provide an electronic device, which may include an electronic component and a semiconductor device electrically connected to the electronic component. The semiconductor device can be manufactured according to the above-described method.

In an embodiment, the semiconductor device may include a semiconductor substrate, a tunnel oxide layer on the semiconductor substrate, a floating gate on the tunnel oxide layer, a gate dielectric layer on the floating gate, and a control gate on the gate dielectric layer. The portion of the tunnel oxide layer disposed on the edge of the active region has a thickness greater than the thickness of the portion of the tunnel oxide layer disposed on the center (i.e., away from the edge) of the active region.

In an embodiment, the electronic device may include a semiconductor device fabricated using the above-described method. The electronic device may be a mobile phone, a laptop, a netbook, a tablet PC, a game console, a TV, a DVD player, a GPS device, a camera, a voice recorder, MP3 player, MP4 player, PSP player, and other semiconductor devices including intermediate products and electronic components that are manufactured using the above-described method to reduce read stress and erase disturb of a flash memory device.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:
1. A semiconductor device comprising:
a semiconductor substrate comprising an active region;
a tunnel oxide layer overlying the semiconductor substrate;

a shallow trench isolation structure disposed at opposite sides of the active region and having an upper surface flush with an upper surface of the semiconductor substrate;

a tunnel oxide thickness enhancing region disposed along a side surface of the shallow trench isolation structure adjacent to the active region and having an upper surface flush with an upper surface of the shallow trench isolation structure;

a floating gate overlying the tunnel oxide layer;

a gate dielectric layer overlying the floating gate; and a control gate overlying the gate dielectric layer, wherein a first portion of the tunnel oxide layer disposed on an edge of the active region and on the tunnel oxide thickness enhancing region has a thickness greater than a thickness of a second portion of the tunnel oxide layer disposed away from the edge of the active region, wherein the tunnel oxide thickness enhancing region is disposed below the first position of the tunnel oxide layer and spaced apart from the second portion of the tunnel oxide layer.

2. The semiconductor device of claim 1, wherein the thickness of the second portion of the tunnel oxide layer is about 89 Angstroms.

3. The semiconductor device of claim 1, wherein the tunnel oxide thickness enhancing region comprises F ions.

4. The semiconductor device of claim 1, wherein the gate dielectric layer comprises a silicon oxide/silicon nitride/silicon oxide (ONO) structure.

5. A method for manufacturing a semiconductor device, the method comprising:

providing a semiconductor substrate comprising an active region;

forming a hard mask on the semiconductor substrate;

etching the semiconductor substrate using the hard mask as a mask to form a trench;

performing an ion implantation onto the semiconductor layer to form a tunnel oxide thickness enhancing region along a side surface of the trench and adjacent to the active region;

forming a shallow trench isolation structure in the trench on the tunnel oxide thickness enhancing region;

removing the hard mask;

forming a tunnel oxide layer in a location previously occupied by the hard mask, wherein a first portion of the tunnel oxide layer disposed on the edge of the active region and on the tunnel oxide thickness enhancing region has a thickness greater than a thickness of a second portion of the tunnel oxide layer disposed away from the edge of the active region; and forming a floating gate on the tunnel oxide layer.

6. The method of claim 5, wherein the ion implantation comprises F ions.

7. The method of claim 5, wherein forming the shallow trench isolation structure comprises:

filling an insulating material in the trench; and performing a CMP process to remove excess of the insulating material over a surface of the hard mask.

8. The method of claim 5, further comprising, after forming the floating gate:

removing excess of an insulating material filled in the shallow trench isolation structure that is over a surface of the semiconductor substrate;

forming a gate dielectric layer overlying the floating gate; and forming a control gate overlying the gate dielectric layer.

9. The method of claim 8, wherein the gate dielectric layer comprises a silicon oxide/silicon nitride/silicon oxide (ONO) structure.

10. The method of claim 5, wherein the ion implantation comprises a fluorine gas ($F_2$).

11. An electronic device comprising an electronic component and a semiconductor device electrically connected with the electronic component, the semiconductor device comprising:

a semiconductor substrate comprising an active region;

a tunnel oxide layer overlying the semiconductor substrate;

a shallow trench isolation structure disposed at opposite sides of the active region and having an upper surface flush with an upper surface of the semiconductor substrate;

a tunnel oxide thickness enhancing region disposed along a side surface of the shallow trench isolation structure adjacent to the active region and having an upper surface flush with an upper surface of the shallow trench isolation structure;

a floating gate overlying the tunnel oxide layer;

a gate dielectric layer overlying the floating gate; and a control gate overlying the gate dielectric layer, wherein a first portion of the tunnel oxide layer disposed on an edge of the active region and on the tunnel oxide thickness enhancing region has a thickness greater than a thickness of a second portion of the tunnel oxide layer disposed away from the edge of the active region, wherein the tunnel oxide thickness enhancing region is disposed below the first position of the tunnel oxide layer and spaced apart from the second portion of the tunnel oxide layer.

12. The electronic device of claim 11, wherein the tunnel oxide thickness enhancing region comprises F ions.

13. The electronic device of claim 11, wherein the gate dielectric layer comprises a silicon oxide/silicon nitride/silicon oxide (ONO) structure.

14. The electronic device of claim 11, wherein the semiconductor device comprises a flash memory device.

15. The electronic device of claim 11, wherein the tunnel oxide thickness enhancing region has an elongated shape extending toward the semiconductor substrate in a direction perpendicular to the gate dielectric layer.

* * * * *